United States Patent
Khenkin et al.

(10) Patent No.: US 10,469,956 B2
(45) Date of Patent: Nov. 5, 2019

(54) MEMS TRANSDUCER PACKAGE

(71) Applicant: Cirrus Logic International Semiconductor Ltd., Edinburgh (GB)

(72) Inventors: Aleksey Sergeyevich Khenkin, Nashua, NH (US); David Patten, Austin, TX (US); Dimitris Drogoudis, Edinburgh (GB)

(73) Assignee: Cirrus Logic, Inc, Austin, TX (US)

( * ) Notice: Subject to any disclaimer, the term of this patent is extended or adjusted under 35 U.S.C. 154(b) by 0 days.

(21) Appl. No.: 15/852,098

(22) Filed: Dec. 22, 2017

(65) Prior Publication Data

US 2018/0279057 A1   Sep. 27, 2018

Related U.S. Application Data

(60) Provisional application No. 62/474,373, filed on Mar. 21, 2017.

(51) Int. Cl.
| | |
|---|---|
| *H04R 19/01* | (2006.01) |
| *H04R 19/04* | (2006.01) |
| *B81B 7/00* | (2006.01) |
| *H01L 27/01* | (2006.01) |
| *H03H 7/06* | (2006.01) |
| *H04R 3/00* | (2006.01) |
| *H04R 19/00* | (2006.01) |
| *H04R 3/06* | (2006.01) |

(52) U.S. Cl.
CPC ........... *H04R 19/04* (2013.01); *B81B 7/0064* (2013.01); *H01L 27/016* (2013.01); *H03H 7/06* (2013.01); *H04R 3/00* (2013.01); *H04R 3/06* (2013.01); *H04R 19/005* (2013.01); *B81B 2201/0257* (2013.01); *B81B 2203/0127* (2013.01); *B81B 2203/04* (2013.01); *B81B 2207/012* (2013.01); *B81B 2207/07* (2013.01); *H04R 19/016* (2013.01); *H04R 2201/003* (2013.01); *H04R 2499/11* (2013.01)

(58) Field of Classification Search
CPC . H04R 19/04; H04R 3/00; H04R 3/06; H04R 19/005; H04R 19/016; H04R 2201/003; H04R 2499/11; H01L 27/016; H03H 7/06; B81B 7/0064; B81B 7/007; B81B 2201/0257; B81B 2203/0127; B81B 2203/04; B81B 2207/012; B81C 1/0023
USPC ... 381/174, 175, 111, 58, 113, 95, 116, 122, 381/355, 369, 171; 438/51
See application file for complete search history.

(56) References Cited

U.S. PATENT DOCUMENTS

| | | | |
|---|---|---|---|
| 4,314,288 A * | 2/1982 | Gyi ....................... | H04B 3/144 360/65 |
| 4,571,724 A * | 2/1986 | Belmondo ....... | G01R 31/31838 714/724 |
| 2005/0270115 A1 | 12/2005 | Chen | |

(Continued)

OTHER PUBLICATIONS

International Search Report and Written Opinion of the International Searching Authority, International Application No. PCT/GB2018/050714, dated Jun. 6, 2018.

*Primary Examiner* — Norman Yu
(74) *Attorney, Agent, or Firm* — Jackson Walker L.L.P.

(57) ABSTRACT

A MEMS transducer package comprising a substrate; a filter circuit for filtering RF signals, the filter circuit comprising a resistor and a capacitor; and an IPD chip; wherein at least a portion of the filter circuit is provided within the IPD chip.

26 Claims, 7 Drawing Sheets

(56) References Cited

U.S. PATENT DOCUMENTS

| | | | |
|---|---|---|---|
| 2008/0232615 A1* | 9/2008 | Song | H04R 19/005 |
| | | | 381/174 |
| 2009/0310810 A1 | 12/2009 | Wu et al. | |
| 2014/0254835 A1* | 9/2014 | Yakura | H03F 3/181 |
| | | | 381/120 |
| 2016/0149542 A1* | 5/2016 | Mucha | H04R 3/00 |
| | | | 381/111 |
| 2017/0041692 A1* | 2/2017 | Watson | H04R 1/023 |

* cited by examiner

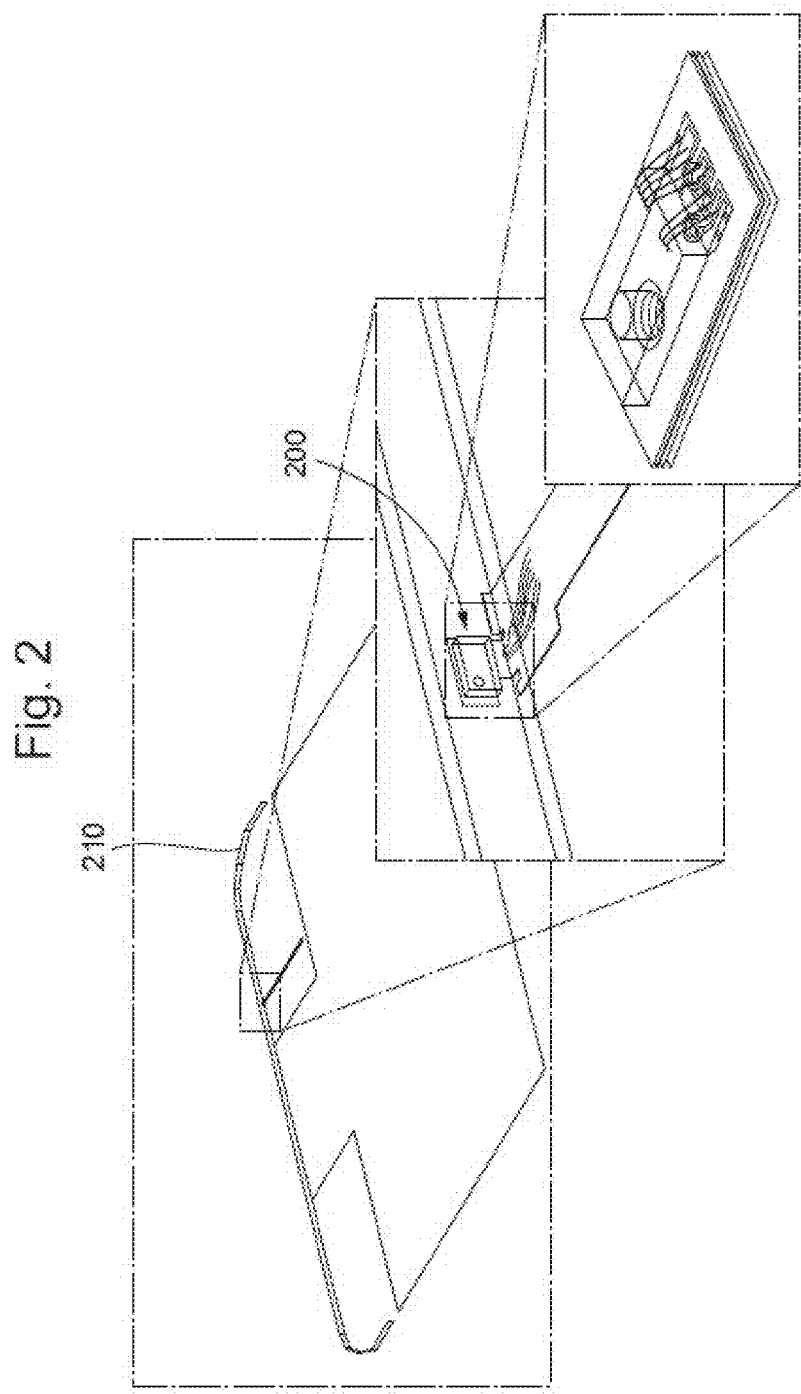

MEMS TRANSDUCER PACKAGE

TECHNICAL FIELD

This application relates to a substrate for a transducer package and to methods and apparatus for packaging of a MEMS transducer. This application further relates to packages for or comprising a MEMS transducer, such as a MEMS microphone.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices.

In particular, MEMS transducers are increasingly being used in portable devices with communication capability, e.g. mobile telephones or the like. Such devices will include at least one antenna for transmitting and receiving RF signals. The amount of power transmitted by such devices can be relatively high and is set to increase with changes to the communication standards. This can cause a problem for MEMS transducers, such as microphones, with CMOS circuitry. The transmitted RF signals can be coupled to the CMOS circuitry and, as the CMOS circuitry is inherently non-linear, such signals may be demodulated to the audio band. This may therefore result in audible noise such as the so-called "bumblebee noise". This problem may be exacerbated when using MEMS microphones with integrated CMOS circuitry as in many devices the position of the antenna happens to be close to the position where the microphone is required.

As a result of this, the transducer and circuitry are often provided in a package which is at least partly shielded to prevent radiated RF from directly coupling to the CMOS circuitry, e.g. radiated RF noise. However it has been appreciated that, in use, conduction of RF noise into the transducer package and to the circuitry of the transducer die can occur via the electrical contacts of the transducer package which connect an output terminal of the transducer to one or more external components. Filter circuits are therefore often also incorporated into the transducer package for filtering this conducted RF noise.

Typically, filter circuits used to filter the RF signals are low pass RC (resistor-capacitor) filter circuits. Such filter circuits may be provided e.g. between an output/input terminal of the transducer circuitry and external contact of the transducer package. MEMS microphones therefore often require passive radio frequency ("RF") filters at their pins, e.g. between an output/input terminal of the transducer circuitry and external contact of the transducer package. Traditional implementation of these filters is a low pass resistor-capacitor ("RC") filter, with a resistor R in series with the pin, and a capacitor C that is shunt to ground.

This traditional circuit presents a problem at direct-current ("DC") and low frequencies. For example, the resistor potentially limits the maximum current that can be provided to the part which affects, e.g., trimming, so the value of the resistor may have to be selected to be sub-optimal for radio frequency ("RF") filtering or manufacturing. Furthermore, the resistor adds to the output impedance of an analogue microphone, limiting application-specific integrated circuit ("ASIC") design choices, and increasing the tolerance of the output impedance, which may make it more challenging to comply with customers' specifications. In some arrangements heat generated by the filter circuit—for example by the resistor of a filter circuit—may affect specified requirements of the transducer package such as the power supply rejection ("PSR").

SUMMARY

Arrangements described herein seek to mitigate some of the problems associated with known filter circuit designs and implementation.

According to an example embodiment of the present invention there is provided a MEMS transducer package comprising:
 a substrate;
 a filter circuit for filtering RF signals, the filter circuit comprising a resistor and a capacitor; and
 an IPD chip; wherein
  at least a portion of the filter circuit is provided within the IPD chip.

The MEMS transducer package may further comprise electronic circuitry, wherein the integrated passive devices chip may be provided between an external electrical connection of the transducer package and an input/output of the electronic circuitry. The resistor may be provided between the external electrical connection of the transducer package and the input/output of the electronic circuitry.

The filter circuit may further comprise an inductor. The IPD chip may comprise the inductor of the filter circuit. The inductor may be provided in parallel with the resistor. The IPD chip may comprise the resistor of the filter circuit. The IPD chip may comprise the capacitor of the filter circuit. The capacitor may be provided between a shared node, said shared node being connected to the inductor and the resistor, and a low impedance node. The capacitor may be connected to a shared node which is connected to the inductor and resistor, on the input side of RF signals.

According to a further example embodiment there is provided a MEMS transducer package comprising a filter circuit for filtering RF signals, the filter circuit comprising:
 a resistor provided between an external electrical connection of the package and electronic circuitry;
  an inductor provided in parallel with the resistor; and
  a capacitor provided between a shared node, said shared node being connected to the inductor and the resistor, and a low impedance node.

At least part of the filter circuit may be provided within an integrated passive devices chip. The resistor and/or the capacitor of the filter circuit may be provided within a substrate of the transducer package.

The characteristics of the inductor and the resistor may be selected so that the transition frequency of the resistor-inductor circuit lies above an audible frequency range and below a radio frequency of interest. The value of the inductor may be selected to have an impedance that is substantially negligible at an audible frequency range and is above an impedance of the resistor above a radio frequency of interest. The resistor may be substantially electrically shorted at an audible frequency range, and the inductor may present a substantially open-circuit above a radio frequency of interest.

The radio frequency of interest may be 700 MHz, 850 MHz, 900 MHz, 1800 MHz or 1900 MHz. The audible frequency range may be between 20 Hz and 20 kHz. The value of the resistor may be 25Ω, the value of the capacitor may be 50 pF and an inductance value of the inductor may be within 30 nH to 300 nH.

In a further example embodiment there is provided a passive filter comprising:
 a resistor placed in series with an input/output ("I/O") pin of a circuit;
 an inductor placed in parallel with the resistor;
 a capacitor placed as a shunt to a common low-impedance node;
  wherein the passive filter is implemented in an integrated passive devices (IPD) chip within a microelectromechanical systems ("MEMS") device package.

The values of the resistor and the capacitor may be selected to present a substantially low-pass filter characteristic at an RF range of interest. The value of the inductor may be selected to have an impedance that is substantially negligible at audio frequencies and is significantly above an impedance of the resistor at the RF range of interest. The resistor may be substantially electrically shorted at audio frequencies, and the inductor may present a substantially open-circuit at the RF range of interest.

The value of the resistor may be 25Ω, the value of the capacitor may be 50 pF, the RF range of interest may be above 700 MHz, and an inductance value of the inductor may be within 30 nH to 300 nH.

The package for a MEMS device may further comprise a MEMS transducer. The MEMS transducer may comprise a microphone. The MEMS transducer may comprise a flexible membrane configured to deflect in response to a pressure differential across the membrane. The MEMS transducer may further comprises a back-plate. The back-plate may comprises a back-plate electrode. The membrane may comprises a membrane electrode. The flexible membrane may be supported relative to the back-plate.

BRIEF DESCRIPTION OF DRAWINGS

For a better understanding of the present invention and to show how the same may be carried into effect, reference will now be made by way of example to the accompanying drawings in which:

FIG. 2 illustrates an example arrangement of an antenna in relation to a transducer package for a MEMS device;

FIG. 4b illustrates a cut through of a portion of the package substrate shown in FIG. 4a;

DETAILED DESCRIPTION OF EMBODIMENTS

Figure 1A:
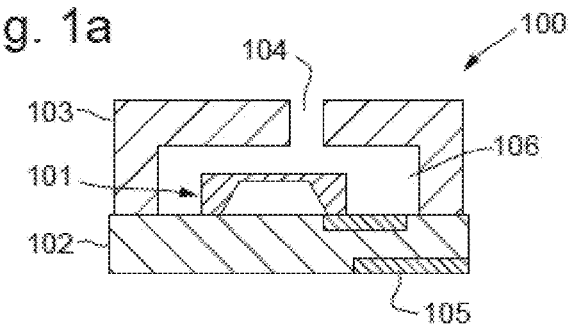
FIGS. 1a-1d illustrate various configurations of a transducer package for a MEMS device.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Throughout this description any features which are similar to features in other figures have been given the same reference numerals.

The drawings are for illustrative purposes only and are not to scale.

MEMS transducers, such as MEMS microphones, are typically provided within a package. The package effectively encloses the MEMS transducer and can provide environmental protection and may also provide shielding for electromagnetic interference (EMI) or the like. The package also provides at least one external connection for outputting the electrical signal to downstream circuitry. For microphones and the like the package will typically have a sound port to allow transmission of sound waves to/from the transducer within the package and the transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one of more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

Figure 1B:
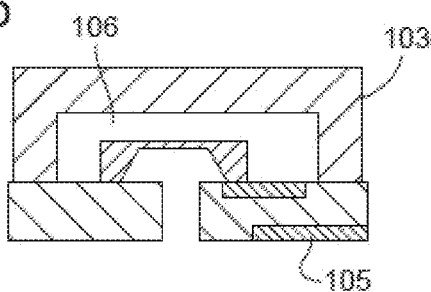

Various package designs are known. For example, FIGS. 1a and 1b illustrate "lid-type" packages 100. A MEMS transducer 101 is mounted to an upper surface of a package substrate 102. The package substrate 102 may be PCB (printed circuit board) or any other suitable material. A cover or "lid" 103 is located over the transducer 101 and is attached to the upper surface of the package substrate 102. The cover 103 may be a metallic lid. In FIG. 1a, an aperture 104 in the cover 103 provides a sound port and allows acoustic signals to enter the package. In FIG. 1b an aperture 104 in the substrate 102 provides the sound port and the MEMS transducer is mounted such that the flexible membrane of the transducer extends over the sound port.

Figure 1C:
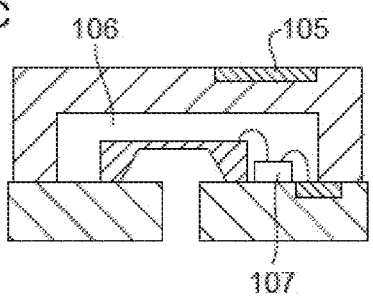
Figure 1D:
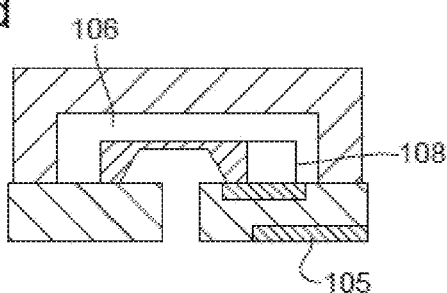

The package may also contain an integrated circuit (electrical circuitry) as shown in FIGS. 1c and 1d provided for the operation of the MEMS transducer. The integrated circuit will typically be formed on a die of semiconductor material and will be customised for a particular application. The integrated circuit will be electrically connected to electrodes of the transducer 101 and an electrically conductive path (not shown) is provided between the integrated circuit and an electrical connection provided on an external surface of the package. The integrated circuit may provide a bias voltage to the transducer and may buffer or amplify a signal from the transducer.

The package can be considered to comprise a cavity or void such that a space or chamber 106 is defined between the upper surface of the substrate 102 and the inner surface of the cover 103. The transducer 101 and the integrated circuit are typically provided within the chamber 106.

Although several different arrangements are known, according to the FIG. 1b arrangement a port hole 104 extends through the substrate 102 of the package. An external electrical connection 105, which may for example comprise solder pads or the like, is provided on the outer surface of the package substrate 102. According to convention, the configuration shown in FIG. 1b—in which the sound port is provided on the same side of the package to the external electrical connection—is known as a "bottom port" configuration. Conversely, an arrangement as shown in FIG. 1a in which the sound port is provided on a different side of the package to the external electrical connection is known as a "top port" configuration. It will be appreciated that the terms "bottom port" or "top port" do not imply any particular orientation of the package device either during manufacture, processing or any subsequent application. In the bottom port arrangement of FIG. 1b, the transducer 101 is supported in a fixed relationship with respect to the package substrate 102 and is arranged such that the flexible membrane of the transducer extends over—or overlies—the acoustic port 104. The transducer is connected to an integrated circuit 106 (not shown) which is also supported by substrate.

FIGS. 1c and 1d illustrate further alternative configurations of the MEMS transducer package. In the arrangement shown in FIG. 1c, which illustrates another top-port configuration, the electrical connection 105 is provided on the outer surface of the lid 103 whilst the transducer is provided relative to a port hole in the package substrate. In FIG. 1d—which illustrates a bottom port configuration similar to the configuration shown in FIG. 1b—the electrical connection 105 is provided on the same side as the sound port. It will be appreciated that the external electrical connection 105 could be provided anywhere on the exterior of the package. In FIG. 1c, an integrated circuit 107 or ASIC is provided on the substrate and is electrically connected to the MEMS transducer. An electrically conductive path (not shown) is provided between the integrated circuit and the electrical connection 105 provided on the outer surface of the lid 103. In the FIG. 1d configuration, the ASIC is integrated with the MEMS transducer die 108.

As will be appreciated by a person skilled in the art, various components of the MEMS package may be arranged using any combination of features illustrated by FIGS. 1a-1d. Furthermore, configurations are envisaged where components such as the transducer structure are provided on the top inner surface of the cover. The cover may not be one continuous piece of material as illustrated, and may instead be formed from different layers. For example, a portion of the lid may be formed from a substrate or PCB similar to that illustrated in any of FIGS. 1a-1d, or as described herein.

As previously mentioned, the MEMS device package may be provided in close proximity to an antenna, and hence RF radiation may be conducted into the internal components of the transducer device via electrical connections, such as bond pads, for connecting the CMOS circuitry with external components.

FIG. 2 illustrates an example of the relative arrangement of an antenna, in this case a GSM antenna 210, positioned adjacent to a MEMS package 200, for example in the case where the MEMS package is provided in a communication device. Communication devices utilising GSM antennas, such as mobile phones, often transmit RF signals a frequency of e.g. 900 MHz, and with characteristics which may allow the transmitted signal to be demodulated to an audible range if conducted into the transducer package. Thus, from consideration of FIG. 2 which illustrates the close proximity of the antenna 210 relative to the MEMS package 200, it will be appreciated that the RF signals transmitted and received by a mobile phone antenna may interfere with signals within the transducer structure, causing noise.

In order to filter one or more of the frequencies of an RF signal incident on a transducer package which may potentially give rise to noise if conducted into the internal components of the package, a filtering path may be provided. For example, a filter circuit may be provided on any conductive path which extends between an external contact of the package and electronic components or circuitry within the transducer package. The filter path or filter circuit may be provided outside the transducer package or may be at least partly provided as a part of the package. In some configurations, the filter path may be provided inside the transducer package and/or may, be provided in conjunction with electronic circuitry such the CMOS circuitry or ASIC.

One or more filter circuits may be located, for example, along any conductive path formed between the electronic components of the MEMS device such as the ASIC and any external electronic components. Thus, the frequencies of RF signals transmitted and received by the antenna of a communication device, which may potentially couple to the CMOS circuitry of the transducer device, are preferably at least partly filtered before they reach the CMOS circuitry. According to one or more examples, the filter circuitry may be arranged to provide a filter for RF noise at frequencies of between 300 Mhz and 2000 MHz, more preferably at around 850 MHz and 900 MHz, or 1800 MHz and 1900 MHz.

Figure 3:
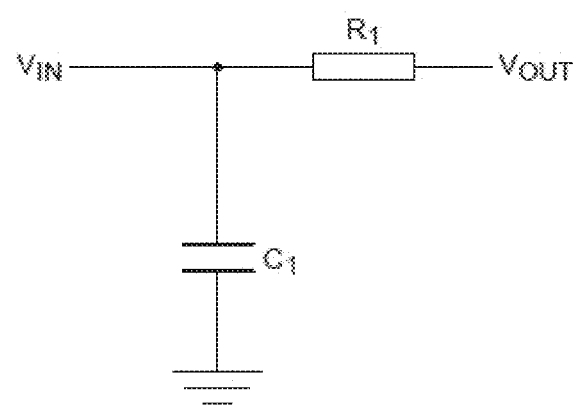
FIG. 3 illustrates a circuit diagram of an RF filter.

An RC filter, such as that shown in the circuit of FIG. 3, is typically used as a filter circuit for filtering RF signals. FIG. 3 illustrates the configuration of a filter circuit provided as part of a transducer package. The filter circuit of FIG. 3 comprises an input Vin and an output Vout on a signal path of an RF signal which has been conducted from one or more external electrical contacts of a transducer package towards electrical components or circuitry provided in the package or an electrode of the transducer. The filter circuit is thus typically located on a path between an external connection of the transducer package and integrated electronic circuitry provided within the package. In the FIG. 3 example, a resistor R1 is provided in series between the input Vin and output Vout of the filter circuit. A capacitor C1 is electrically connected to a node positioned between the input Vin of the filter circuit and the resistor R1, with one plate electrically connected to the node and the other plate electrically connected to a reference voltage terminal, for example ground. Thus, this circuit forms a first order RC low-pass filter for RF signals. As will be well known to those skilled in the art, in such a circuit, for low frequency input signals having low frequencies, the capacitive reactance is high, compared to the resistive value of the resistor, so that low frequency signals pass through the resistor. At higher frequencies, the capacitive reactance of the capacitor drops, and the capacitor, which is connected to ground, effectively functions as a short circuit. Thus, in an ideal system, only frequencies below a cutoff frequency pass through the filter.

According to one or more examples discussed herein, the circuit of FIG. 3, or any filter circuit, may be formed at least partly within the substrate of a transducer package. The package substrate may comprise a plurality of layers of alternating dielectric material and conductive material, such as metal. Thus, the metal layers of the substrate may be patterned and electrically connected to one another in such a way so as to form the required filter circuit.

Figure 4A:
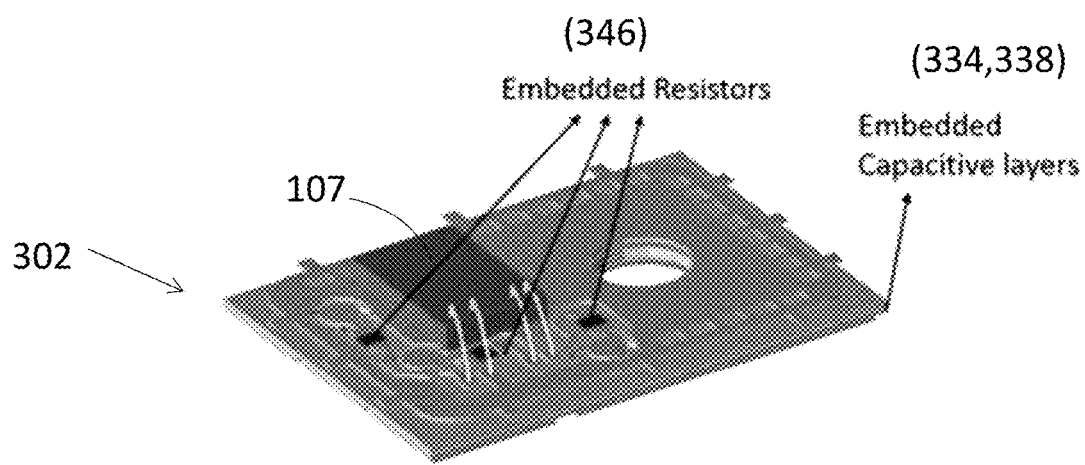
FIG. 4a illustrates a perspective view of an RF filter implemented in a package substrate.

FIG. 4a shows a perspective view of an example of a MEMS microphone package substrate comprising the filter circuit of FIG. 3. In this Figure, three filter circuits are provided, one at each of three terminals, or pins, which serve as positive and negative outputs and a power supply of electronic circuitry 107. It will be appreciated that any number of filter circuits may be provided, such that each or any path from the electronic circuitry to a connection external to the transducer package comprises a filter circuit. Furthermore, it will be appreciated that each path may comprise a different filter circuit. The components of FIG. 3 are implemented within the layers of the MEMS microphone package substrate 302. In this example, the resistors 346 of the filter circuits are embedded in an upper layer of the package substrate, with capacitive elements formed in conductive layers 334, 338 below the layer in which the resistors are formed.

Figure 4B:
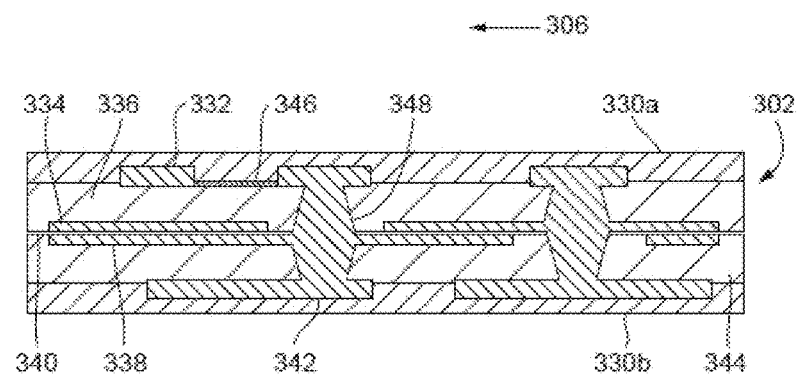

FIG. 4b illustrates a cut through of a portion of the package substrate 302 shown in FIG. 4a. This portion of the package substrate comprises the filter circuit of FIG. 3. The package substrate 302 shown in this example comprises a plurality of layers. Embedded within or provided on the layers of the package substrate are a plurality of conductive or metal layers. The upper layer of the substrate 330a forms an upper surface of the substrate which, in use, may be at least partly in contact with a cavity 306 of the transducer package. In this example, a first layer of solder resist forms the first or upper layer 330a of the package substrate. The package substrate further comprises first and third layers of dielectric material 336 and 338 and a second, or bottom, layer of solder resist 330b. A core 340 layer—or second layer of dielectric material—is disposed in between the plane of the first and third layers of dielectric material.

The package substrate 302 further comprises a first, or top, metal layer 332 which, in this example, is formed at least partly within the upper layer 330a of the substrate. The metal layer 332 forms at least a part of an interface for forming an electrical connection with other components of the MEMS device, such as the ASIC. The conductive material of the top metal layer 332 is also used to form a resistor 346 of the filter circuit, i.e. a component that is deliberately introduced to provide a desired resistance as part of a specific filter. A second metal 334 layer is positioned in a plane below the first metal layer 332, and is at least partly separated from the first metal layer 332 by the first layer of dielectric material 336. The dielectric material may be e.g. pre-preg (pre-impregnated composite fibres reinforced with a resin system). The second metal layer 334 is electrically connected to a conductive path (not shown) which extends to a ground terminal of the filter circuit, and thus forms a ground plane of the package substrate 302. A third metal layer 338 is positioned below the second metal layer 334 and is at least partly separated from the second metal layer 334 by the substrate core which may be considered to be a second layer of dielectric material 340 different to the first dielectric material. The third metal layer 338 is electrically connected so as to form a power plane of the package substrate 302. A part of the second metal layer 334 and a part of the third metal layer 338 which are arranged to define parallel conductive plates form a capacitor of the filter circuit, i.e. a component that is deliberately introduced to provide a desired capacitance as part of a specific filter. A fourth metal layer 342 is provided below the third metal layer 338. The fourth metal 342 layer is at least partly separated from the third metal layer 338 by the third dielectric layer 344. The fourth metal layer 342 is patterned to form at least part of the input/output pads for providing an electrical connection to one or more external circuits. These may, for example, be a land grid array (LGA) which provide contacts for surface mounting of the transducer package.

The second layer of solder resist 330b is provided in a plane below the fourth metal layer 342, and at least partly covers the fourth metal layer 342.

A portion of the fourth metal layer 342 which provides the external I/O connection for the transducer package is electrically connected, by a first via 348, or the like, through the third dielectric layer 344 of the package substrate 302, to the conductive plate formed in the third metal layer 338. Thus, a first conductive plate of the first capacitor C1 of the filter circuit shown in FIG. 3 is formed from a portion of the third metal layer 338. A second conductive plate of the first capacitor C1 is formed from a portion of the second metal layer 334 which is connected to ground, and separated from the third metal layer 338 by the second layer of dielectric 340. The third metal layer 338 is also electrically connected by the first via 348 to the first metal layer 332. A resistor 346, shown in FIG. 3 as R1, is formed in the first metal layer 332 between the first via 348 and an interface for electrical connection to the transducer circuitry. Thus, the components and connections as shown in the circuit of FIG. 3 are achieved i.e. implemented within the package substrate.

In the arrangement illustrated in FIG. 4b, the resistor is provided by the material that forms the first (top or upper), layer of metal 332, this metal layer being provided at or near the top plane of the transducer substrate i.e. the plane of the package substrate that is at least partly in contact with the chamber of the package in use.

The package substrate 302 shown in FIG. 4b comprises an upper, or first, layer 330a. It is intended that the upper layer of the substrate will form at least part of a surface (inner surface) of a chamber 306 of a transducer package in use. In the orientation illustrated in FIG. 4b, the chamber is illustrated as being above the surface of layer 330a of the package substrate 302. However, it will be appreciated that the package substrate may be oriented differently in use or during fabrication, e.g. so that the chamber extends in a direction below the "top" surface of layer 330a. Thus, the relative terms "upper", "lower", "top", "bottom" etc should be interpreted accordingly. The chamber 306 may comprise, for example, a volume of air, or a vacuum. The electronic circuitry for the MEMS device and alternatively or additionally the transducer may also be at least partly in contact with the chamber 306 of the transducer package.

It will of course be appreciated that a layer of the substrate which forms a component of the filter circuit may have been patterned to be discontinuous. As used herein the term layer therefore refers to any instances of the same material that was deposited or formed at the same time and thus appears in the same order in the stack of materials at different places.

Furthermore, it will be appreciated that metal interconnects for instance may be associated with a parasitic capacitance or inductance. In embodiments of the present invention however the relevant metal layer is patterned to form part of a resistive, capacitive or inductive component that provides more than simply parasitic capacitance or inductance.

Figure 5:
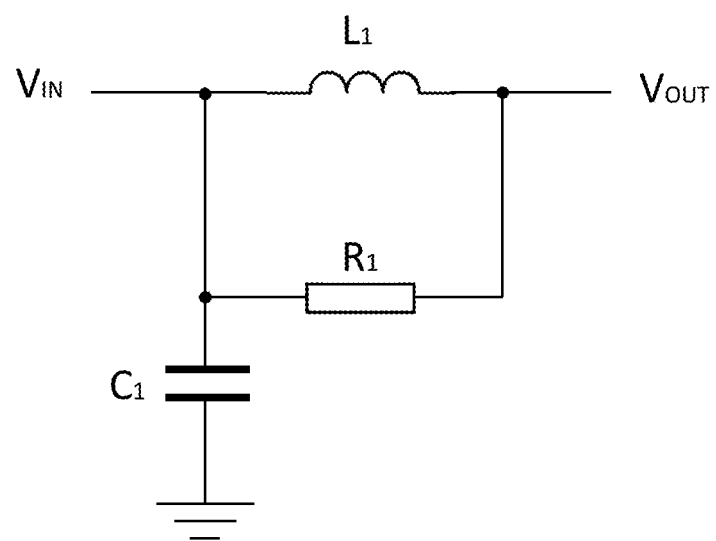
FIG. 5 illustrates a further RF filter according to an example embodiment.

FIG. 5 illustrates a filter circuit according to an example embodiment. This embodiment differs from the filter circuit shown in FIG. 3 in that the circuit further comprises an inductor L1 electrically connected, or provided in parallel, with the resistor R1. In this example, the inductor L1 is provided in series between an input node Vin of a conductive path which may comprise RF signals and an output node Vout. External electrical contacts of the transducer package (not shown) are electrically connected to the input node Vin of the circuit, and the electronic circuitry, i.e. the ASIC (not shown) is electrically connected to the output node Vout of the circuit. The load impedance of the electronic circuitry may form a part of the filter circuit. For example, if the load impedance is primarily capacitive, the filter will form a π-filter. The inductor L1 is provided in parallel with the resistor R1. A capacitor C1 is provided at a node which is common to, or shared by, the resistor R1 and the inductor L1. The capacitor C1 is provided on the Vin side of the resistor R1 and inductor L1. The capacitor C1 comprises a first capacitive plate and a second capacitive plate to form a capacitive pair. The first capacitive plate of the capacitor pair is connected to the node shared by the resistor and inductor, and the second capacitive plate of the capacitor pair is electrically connected to a reference voltage terminal, or low impedance node, i.e. ground. It will be appreciated that the second plate of the capacitor pair may be electrically connected to a terminal which is biased to a voltage different to that of the first capacitive plate.

In this circuit, for input signals having low frequencies, e.g., within and below the audio frequency range, the capacitive reactance is high, and the impedance of the inductor is low. Thus, the resistor R1 is essentially shorted out, presenting no added resistance to the line. As the frequency increases, the impedance of the inductor increases so that, at higher frequencies, e.g., within the RF range of interest, the inductor presents essentially an open-circuit, allowing the resistor to act as a part of a radio frequency interference ("RFI") filter. The capacitive reactance will decrease with an increase in frequency, so that at high frequencies, the capacitor, which is connected to ground, essentially functions as a short circuit to ground. Therefore, in an ideal system, only frequencies below a cutoff frequency pass through the filter. This circuit can therefore be tuned to act to filter particular frequencies by the selection of values of the components.

The value of the inductor may thus be selected to have an impedance that is substantially negligible at an audible frequency range and is above an impedance of the resistor above a radio frequency of interest. Values of the resistor and the capacitor may be selected to present a substantially low-pass filter characteristic at an RF range of interest.

The value of the inductor L1 may be selected such that the transition frequency (−3 dB point) of the inductor-resistor circuit lies above the audible frequency range (20 Hz and 20 kHz), but below an RF range of interest (in this case, 850 MHz/900 MHz or 1800 MHz/1900 MHz). For example, if the resistor is given a value of 25 Ω and the value of the first capacitor is 50 pF, the value of the inductor may be selected to lie between the values of 30 nH and 300 nH.

The advantages provided by this circuit are that at low frequencies there is no added resistance to the line, so microphone performance is not affected by the additional resistance. At very high frequencies, the resistor forms a part of the RF filter, thereby allowing a designer a greater freedom in component value selection to optimize RF filter performance.

Figure 6:
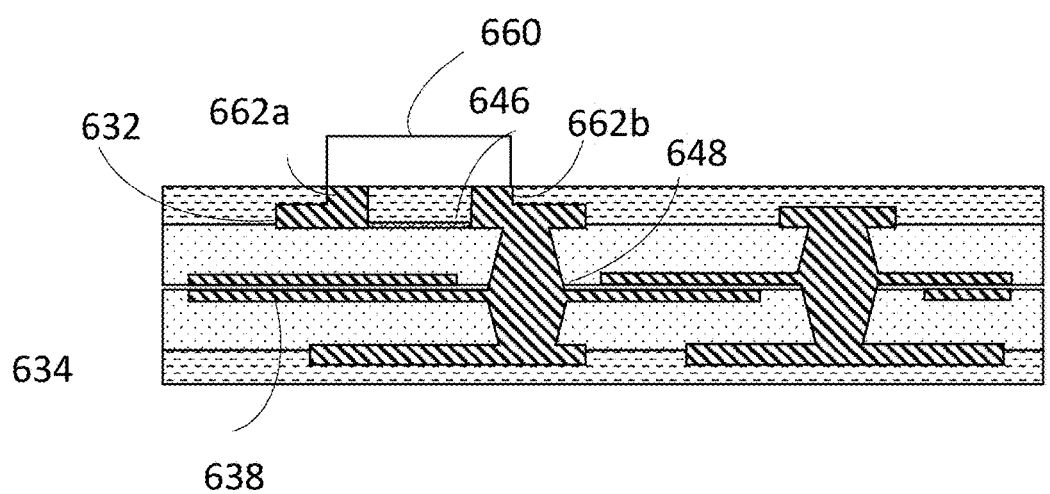
FIG. 6 illustrates a package comprising the RF filter of FIG. 5 in according to an example embodiment.

FIG. 6 illustrates an example embodiment of the configuration of the circuit shown in FIG. 5. This embodiment differs from the configuration of the filter circuit shown in FIG. 4b in that the circuit further comprises an inductor 660 electrically connected, or provided, in parallel with the resistor 646. In the same way as the arrangement shown in FIG. 4b, the resistor 646 and capacitive plates 634, 638 are provided within the package substrate. The inductor 660 is provided as an external component on the upper surface of the package substrate, i.e. a surface which is at least partly in contact with a chamber of the transducer package. Metal interconnects 662a, 662b are provided on either side of the resistor 646 in the first metal layer 632. A first metal interconnect 662a is provided between the input/output for connection to external circuits, i.e. an ASIC, and the resistor 646. A second metal interconnect 662b is provided between the resistor 646 and the via 648. An inductor 660 is electrically connected to the first 662a and second 662b metal interconnects, thus forming a connection in parallel with the resistor 646. Thus, an arrangement of the circuit illustrated in FIG. 5 is realised.

Figure 7:
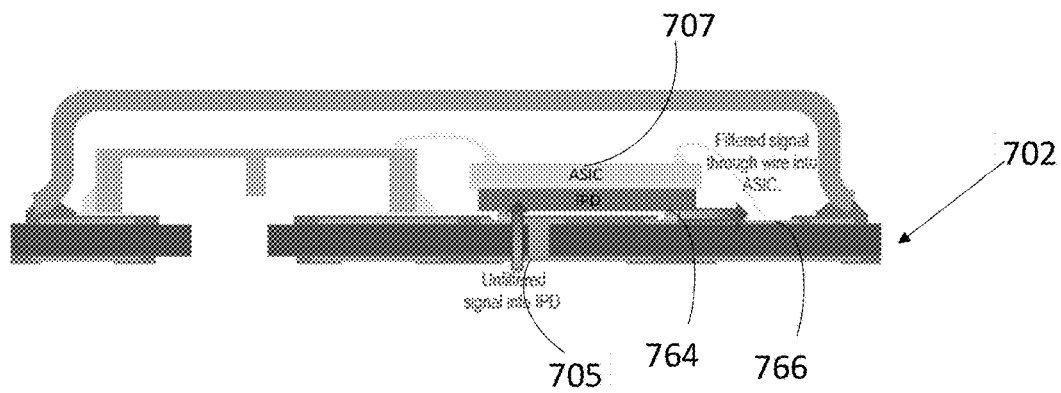
FIG. 7 illustrates a package comprising an IPD chip according to an example embodiment.

FIG. 7 shows a further example embodiment of the implementation of a filter where at least part of a filter circuit is provided within an IPD (integrated passive devices) chip. IPD chips are generally fabricated using wafer fabrication technologies such as thin film and photolithography processing, and passive devices such as resistors, capacitors and inductors may be formed within IPD chips. The substrates which are used for IPD chips are typically thin film substrates, e.g. silicon, aluminium, glass. IPD chips may be flip chip mountable or wire bondable.

The IPD chip 764 is provided on the upper surface of a package substrate 702 and is electrically connected between external electrical contacts 705 of the package substrate 702 and an input/output 766 of an ASIC, or electronic circuitry, 707. Thus, at least a portion of an RF signal which may be conducted into the transducer package via the external electrical contacts 705 of the package substrate 702 passes through the IPD chip 764 before entering the ASIC 707. The RF filters of FIG. 3 and/or FIG. 5 may be implemented in the IPD (Integrated Passive Devices) chip 764. Thus, a resistor-capacitor ("RC") radio-frequency ("RF") filter and/or an inductor-resistor-capacitor ("LRC") radio-frequency ("RF") filter is provided within the IPD chip, between an input of an RF signal, and electronic circuitry for operation of the MEMS device. It should be appreciated that any number of filter circuits, for any number of conductive paths from external electrical contacts to electronic circuitry such as the ASIC, may be provided within the IPD chip. Each filter circuit may be the same as the other filter circuits, or some or all of the filter circuits may differ from the others.

IPD chips incorporate semiconductor technologies which allow passive devices to be formed with ranges of values per unit volume which are far greater than those achievable by standard passive component technologies. Thus, passive devices implemented in IPD chips are available in a smaller form factor. An advantage of using an IPD chip comprising all or part of a filter circuit is therefore that a more efficient use of space and greater flexibility of the arrangement of components of the transducer package may be achieved.

An advantage of a configuration in which the resistor is formed in an IPD chip, rather than in a layer of the substrate proximate to a cavity of the transducer package, is that the total RF power required to reach an immunity threshold is significantly higher. This is because the heat dissipated in the resistor is isolated from the chamber of the transducer package, preventing the thermo-acoustical coupling effects. Thus, the power supply rejection (PSR) of the microphone is improved.

It will be appreciated that at least a part of the filter circuit may be formed within the package substrate, and a part of the circuit may be formed within the IPD chip. For example, the capacitor or resistor may be formed in one of the IPD chip or package substrate, and the other component of the resistor or the capacitor may be formed in the other of the IPD chip or package substrate. Furthermore, the IPD chip may be provided anywhere within the transducer package, where it is provided in a signal path between external contacts of the transducer package and internal electronic circuitry. For example, in some embodiments the IPD chip may be provided on the lid of the transducer package. Preferably, the path between the IPD and the electronic circuitry is provided within the exterior of the transducer package.

Advantageously, as an IPD chip comprising at least part of a filter circuit may be positioned anywhere within the transducer package, this example embodiment allows for a much greater freedom of design of the transducer package.

Embodiments of the present invention are particularly applicable to packages comprising a MEMS sensor transducer, especially MEMS capacitive transducers such as MEMS microphones. It will also be appreciated that other types of MEMS capacitive sensors could be provided within the package, for example accelerometers, pressure sensors, proximity sensors or flow meters.

Microphone devices formed using MEMS fabrication processes typically comprise one or more moveable membranes and a static back-plate, with a respective electrode deposited on the membrane(s) and back-plate, wherein one electrode is used for read-out/drive and the other is used for biasing. A substrate supports at least the membrane(s) and typically the back-plate also. In the case of MEMS pressure sensors and microphones the read out is usually accomplished by measuring the capacitance between the membrane and back-plate electrodes. In the case of transducers, the device is driven, i.e. biased, by a potential difference provided across the membrane and back-plate electrodes. In use, in response to a sound wave corresponding to a pressure wave incident on the microphone, the membrane is deformed slightly from its equilibrium or quiescent position. The distance between the membrane electrode and the back-plate electrode is correspondingly altered, giving rise to a change in capacitance between the two electrodes that is subsequently detected by electronic circuitry.

Typically, capacitive microphone devices comprise a membrane layer which forms a flexible membrane which is free to move in response to pressure differences generated by sound waves. A first electrode is mechanically coupled to the flexible membrane, and together they form a first capacitive plate of the capacitive microphone device. A second electrode is mechanically coupled to a generally rigid structural layer or back-plate, which together form a second capacitive plate of the capacitive microphone device. For example, the second electrode may be embedded within the back-plate structure.

The capacitive microphone is formed on a substrate, for example a silicon wafer which may have upper and lower oxide layers formed thereon. A cavity in the substrate and in any overlying layers (hereinafter referred to as a substrate cavity) is provided below the membrane, and may be formed using a "back-etch" through the substrate. The substrate cavity connects to a first cavity located directly below the membrane. These cavities and may collectively provide an acoustic volume thus allowing movement of the membrane in response to an acoustic stimulus. Interposed between the first and second electrodes and is a second cavity. A plurality of holes, hereinafter referred to as bleed holes, may be provided to connect the first cavity and the second cavity.

A plurality of acoustic holes may be provide in the back-plate so as to allow free movement of air molecules through the back plate, such that the second cavity forms part of an acoustic volume with a space on the other side of the back-plate. The membrane is thus supported between two volumes, one volume comprising cavities and substrate cavity and another volume comprising cavity and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

The membrane layer and thus the flexible membrane of a MEMS transducer generally comprises a thin layer of a dielectric material—such as a layer of crystalline or polycrystalline material.

The cavity in the substrate may be formed in any known way. Advantageously the cavity may have a cross sectional area that increases towards the lower side of the substrate. Thus, the cavity immediately underlying the transducer may have a first cross sectional area so that the area of the membrane is defined accurately. Towards the lower side of the die substrate the cross sectional area of the cavity may be larger so as to maximise the part of the back volume provided by the cavity. In some embodiments there may be a step change in the slope profile of the walls of the cavity. Such a cavity profile may be achieved by a multi-stage etching process such as described in the patent GB2451909.

Embodiments may be implemented in a host device, especially a portable and/or battery powered host device such as a mobile telephone, and audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element. Further embodiments likewise, with the benefit of this disclosure, will be apparent to those having ordinary skill in the art, and such embodiments should be deemed as being encompassed herein.

The invention claimed is:

1. A MEMS transducer package comprising:
a package substrate;

a filter circuit for filtering RF signals, the filter circuit comprising components including a resistor, a capacitor and an inductor, wherein the filter circuit is arranged so that the resistor is electrically shorted at an audible frequency range, and the inductor presents an open-circuit above a cutoff radio frequency; and an IPD chip; wherein:

at least one of the components of the filter circuit is provided within the IPD chip; and at least one of the resistor and capacitor of the filter circuit is provided within the package substrate.

2. A MEMS transducer package as claimed in claim 1, further comprising electronic circuitry, wherein the integrated passive devices chip is provided between an external electrical connection of the transducer package and an input/output of the electronic circuitry.

3. A MEMS transducer package as claimed in claim 2, wherein the resistor is provided between the external electrical connection of the transducer package and the input/output of the electronic circuitry.

4. A MEMS transducer package as claimed in claim 1, wherein the IPD chip comprises at least one selected from among the inductor, the resistor and the capacitor of the filter circuit.

5. A MEMS transducer package as claimed in claim 1, wherein the inductor is provided in parallel with the resistor and the capacitor is provided between a shared node, said shared node being connected to the inductor and the resistor, and a low impedance node.

6. A MEMS transducer package comprising a filter circuit, the filter circuit comprising:

a resistor provided between an external electrical connection of the package and electronic circuitry;

an inductor provided in parallel with the resistor; and a capacitor provided between a shared node, said shared node being connected to the inductor and the resistor, and a low impedance node wherein the filter circuit is provided to filter RF signals.

7. A MEMS transducer package as claimed in claim 6, wherein at least part of the filter circuit is provided within an integrated passive devices chip.

8. A MEMS transducer package as claimed in claim 6, wherein the resistor and/or the capacitor of the filter circuit is provided within a substrate of the transducer package.

9. A package for a MEMS device as claimed in claim 1, wherein the characteristics of the inductor and the resistor are selected so that the transition frequency of the resistor-inductor circuit lies above an audible frequency range and below a cutoff radio frequency.

10. A MEMS transducer package as claimed in claim 1, wherein the value of the inductor is selected to have an impedance that is negligible at an audible frequency range and to have an impedance that is above an impedance of the resistor above a cutoff radio frequency.

11. A package for a MEMS device as claimed in claim 10, wherein the cutoff radio frequency is 700 MHz, 850 MHz, 900 MHz, 1800 MHz or 1900 MHz, and/or the audible frequency range is between 20 Hz and 20 kHz.

12. A MEMS transducer package as claimed in claim 1, wherein the value of the resistor is 25 S2, the value of the capacitor is 50 pF and an inductance value of the inductor is within 30 nH to 300 nH.

13. A passive filter comprising:

a resistor placed in series with an input/output ("1/0") pin of a circuit;

an inductor placed in parallel with the resistor;

a capacitor placed as a shunt to a common low-impedance node;

wherein the passive filter is implemented in an integrated passive devices (IPD) chip within a microelectromechanical systems ("MEMS") device package; wherein values of the resistor and the capacitor are selected to present a low-pass filter characteristic at an RF range over a cutoff frequency; wherein the value of the inductor is selected to have an impedance that is negligible at audio frequencies and is significantly above an impedance of the resistor at the RF range over a cutoff frequency; and wherein the resistor is electrically shorted at an audible frequency range, and wherein the inductor presents an open-circuit at an RF range over a cutoff frequency.

14. A passive filter of claim 13, wherein the value of the resistor is 25 S2, the value of the capacitor is 50 pF, the cutoff frequency is 700 MHz, and an inductance value of the inductor is within 30 nH to 300 nH.

15. A package for a MEMS device as claimed in claim 13, further comprising a MEMS transducer, wherein said MEMS transducer comprises a microphone.

16. A package for a MEMS device as claimed in claim 15, wherein the MEMS transducer comprises a flexible membrane configured to deflect in response to a pressure differential across the membrane.

17. A package for a MEMS device as claimed in claim 15, the MEMS transducer further comprising a back-plate, wherein the flexible membrane is supported relative to the back-plate.

18. A package for a MEMS device as claimed in claim 17, wherein the back-plate comprises a back-plate electrode and flexible membrane comprises a membrane electrode.

19. A package for a MEMS device as claimed in claim 1, further comprising a MEMS transducer, wherein said MEMS transducer comprises a microphone.

20. A package for a MEMS device as claimed in claim 19, wherein the MEMS transducer comprises a flexible membrane configured to deflect in response to a pressure differential across the membrane.

21. A package for a MEMS device as claimed in claim 19, the MEMS transducer further comprising a back-plate, wherein the flexible membrane is supported relative to the back-plate.

22. A package for a MEMS device as claimed in claim 21, wherein the back-plate comprises a back-plate electrode and flexible membrane comprises a membrane electrode.

23. A package for a MEMS device as claimed in claim 6, further comprising a MEMS transducer, wherein said MEMS transducer comprises a microphone.

24. A package for a MEMS device as claimed in claim 23, wherein the MEMS transducer comprises a flexible membrane configured to deflect in response to a pressure differential across the membrane.

25. A package for a MEMS device as claimed in claim 23, the MEMS transducer further comprising a back-plate, wherein the flexible membrane is supported relative to the back-plate.

26. A package for a MEMS device as claimed in claim 25, wherein the back-plate comprises a back-plate electrode and flexible membrane comprises a membrane electrode.

* * * * *

UNITED STATES PATENT AND TRADEMARK OFFICE
CERTIFICATE OF CORRECTION

PATENT NO. : 10,469,956 B2
APPLICATION NO. : 15/852098
DATED : November 5, 2019
INVENTOR(S) : Khenkin et al.

Page 1 of 1

It is certified that error appears in the above-identified patent and that said Letters Patent is hereby corrected as shown below:

In the Claims

Column 13, Lines 59-62 Please amend Claim 12 as follows:
12. A MEMS transducer package as claimed in claim 1, wherein the value of the resistor is 25 Ω, the value of the capacitor is 50 pF and an inductance value of the inductor is within 30 nH to 300 nH.

Column 13, Lines 63-66 and Column 14, Lines 1-17 Please amend Claim 13 as follows:
13. A passive filter comprising:
    a resistor placed in series with an input/output ("I/O") pin of a circuit;
        an inductor placed in parallel with the resistor;
        a capacitor placed as a shunt to a common low-impedance node;
            wherein the passive filter is implemented in an integrated passive devices (IPD) chip within a microelectromechanical systems ("MEMS") device package; wherein values of the resistor and the capacitor are selected to present a low-pass filter characteristic at an RF range over a cutoff frequency;
wherein the value of the inductor is selected to have an impedance that is negligible at audio frequencies and is significantly above an impedance of the resistor at the FR range over a cutoff frequency; and wherein the resistor is electrically shorted at an audible frequency range, and wherein the inductor presents an open-circuit at an RF range over a cutoff frequency.

Column 14, Lines 18-21 Please amend Claim 14 as follows:
14. A passive filter of claim 13, wherein the value of the resistor is 25 Ω, the value of the capacitor is 50 pF, the cutoff frequency is 700 MHz, and an inductance value of the inductor is within 30 nH to 300 nH.

Signed and Sealed this
Seventeenth Day of March, 2020

Andrei Iancu
*Director of the United States Patent and Trademark Office*